US 6,724,092 B2

(12) United States Patent
Higuchi (10) Patent No.: US 6,724,092 B2
(45) Date of Patent: Apr. 20, 2004

(54) SEMICONDUCTOR DEVICE HAVING A WIRING PATTERN AND METHOD FOR MANUFACTURING THE SAME

(75) Inventor: Toshihiko Higuchi, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/754,818

(22) Filed: Jan. 4, 2001

(65) Prior Publication Data

US 2002/0006732 A1 Jan. 17, 2002

(30) Foreign Application Priority Data

Jan. 6, 2000 (JP) .......................... 2000-000935
Dec. 26, 2000 (JP) .......................... 2000-394959

(51) Int. Cl.[7] .................. H01L 23/48; H01L 23/52; H01L 29/40
(52) U.S. Cl. .......................... 257/786; 257/775
(58) Field of Search .................. 257/786, 775, 257/784, 758

(56) References Cited

U.S. PATENT DOCUMENTS

| 5,506,450 | A | * | 4/1996 | Lee et al. ............... 257/758 |
| 5,561,327 | A | * | 10/1996 | Jun ............... 257/758 |
| 5,616,961 | A | * | 4/1997 | Kohyama ............... 257/774 |
| 5,783,864 | A | * | 7/1998 | Dawson et al. ............... 257/758 |
| 5,916,715 | A | * | 6/1999 | Fulford, Jr. et al. ............... 430/22 |
| 6,166,441 | A | * | 12/2000 | Geryk ............... 257/773 |
| 6,340,631 | B1 | * | 1/2002 | Chih-Po et al. ............... 438/618 |
| 6,362,527 | B1 | * | 3/2002 | Mehta ............... 257/758 |
| 6,380,554 | B1 | * | 4/2002 | Bush et al. ............... 257/758 |

* cited by examiner

Primary Examiner—Phat X. Cao
(74) Attorney, Agent, or Firm—Hogan & Hartson, LLP (57) ABSTRACT

A semiconductor device has a wiring pattern formed by etching a conductive layer using a resist pattern as a mask. The semiconductor device includes a contact section and a wiring. The contact section is formed in an interlayer dielectric layer. The wiring has a connection region to be connected to the contact section. The connection region of the wiring has a generally square plan configuration. The wiring has an extension section extending in a non-wiring region in the connection region.

27 Claims, 8 Drawing Sheets

(PRIOR ART)

Fig. 7

(PRIOR ART)

Fig. 8

(PRIOR ART)

Fig. 9

(PRIOR ART)

SEMICONDUCTOR DEVICE HAVING A WIRING PATTERN AND METHOD FOR MANUFACTURING THE SAME

BACKGROUND OF INVENTION

1. Technical Field of the Invention

The present invention relates to a semiconductor device having a wiring pattern that is formed by etching a conductive layer using a resist pattern as a mask, and a method for manufacturing the same.

2. Background of the Invention

First, a general method for manufacturing wiring patterns in a semiconductor device is described.

Figure 6:
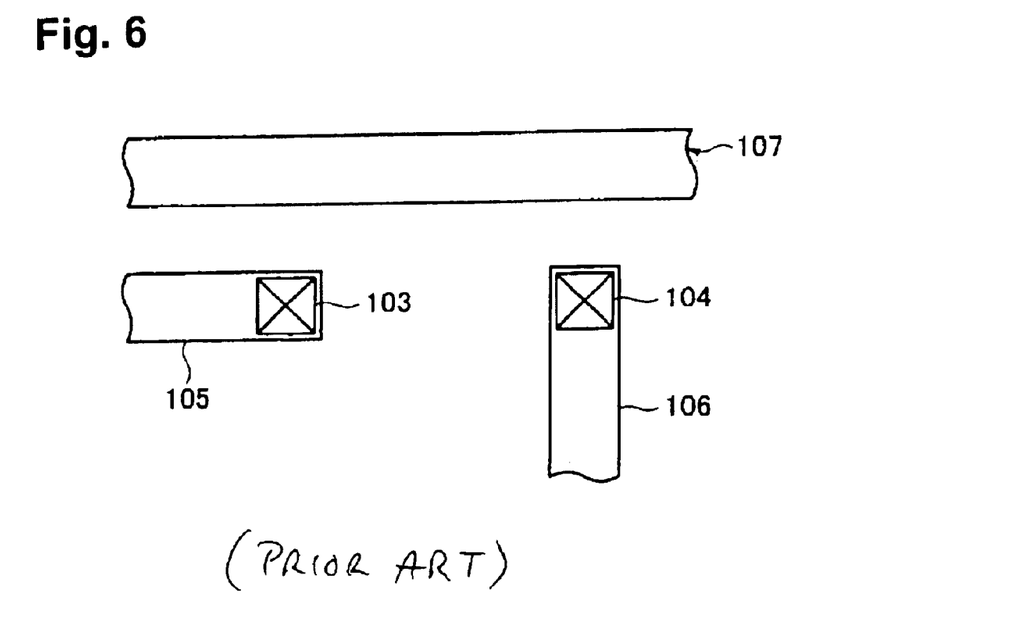
FIG. 6 shows a plan view of a mask pattern for forming wiring patterns in a common semiconductor device.
Figure 7:
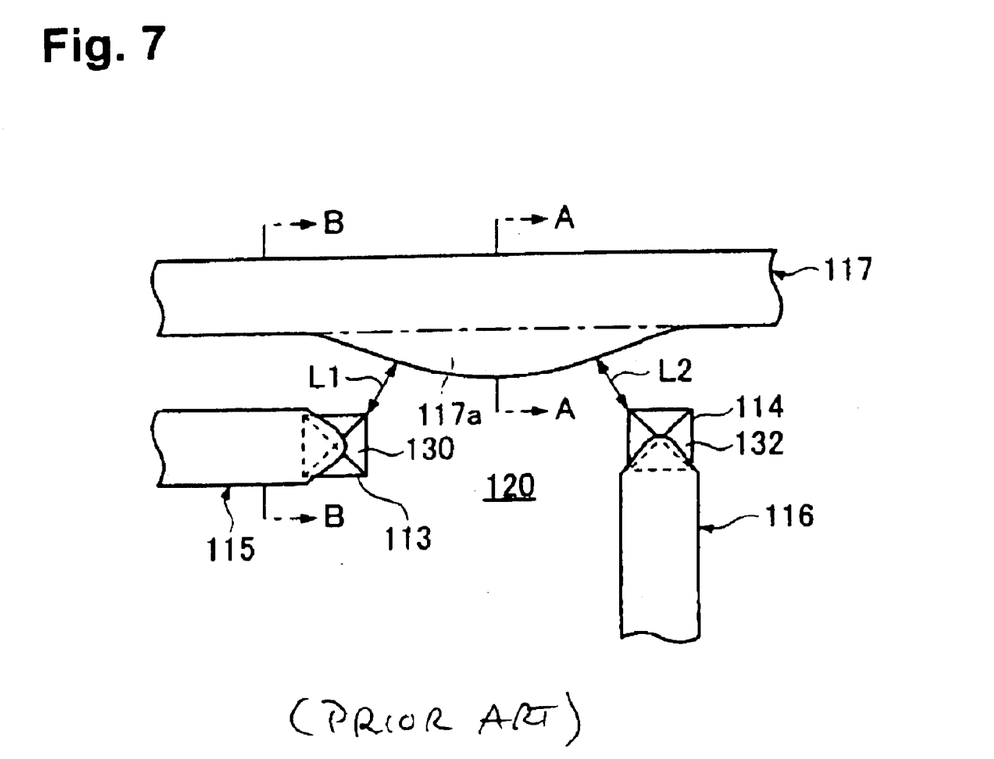
FIG. 7 shows a plan view of wiring patterns that are formed by photolithography technique and etching technique using the mask pattern shown in FIG. 6 as a mask.
Figure 8:
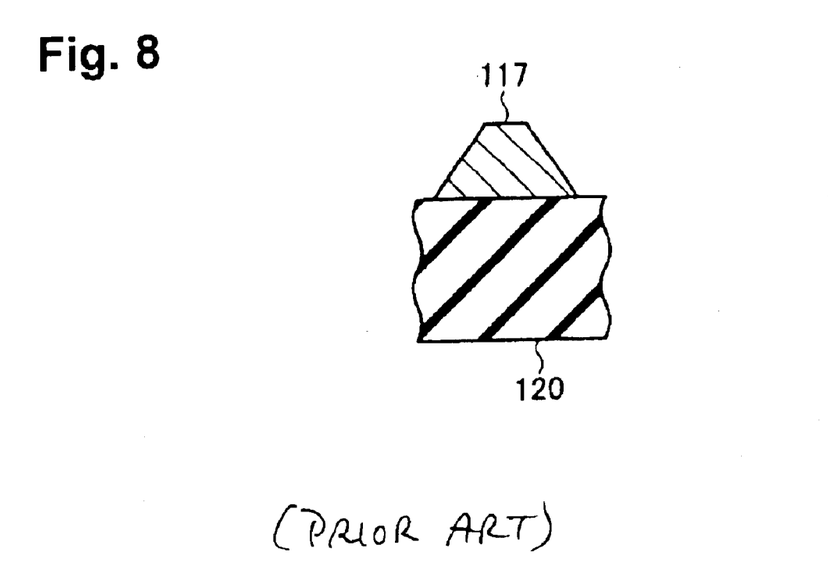
FIG. 8 shows a cross-sectional view taken along lines A—A shown in FIG. 7.
Figure 9:
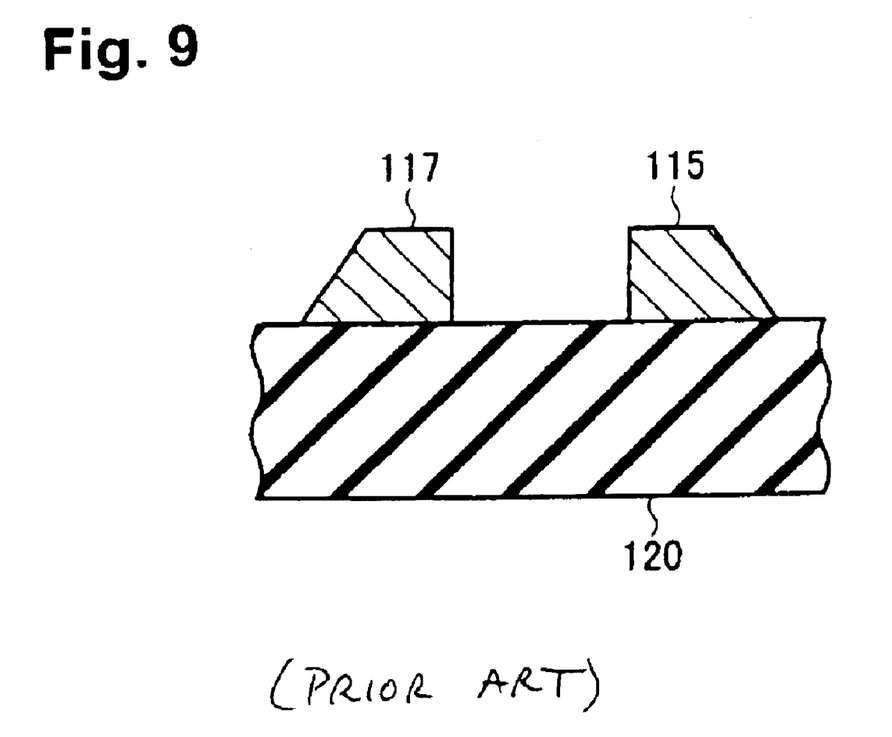
FIG. 9 shows a cross-sectional view taken along lines B—B shown in FIG. 7.

FIG. 6 shows a plan view of a mask pattern for forming resist patterns. FIG. 7 shows a plan view of wiring patterns that are formed by using resist patterns obtained by the mask pattern shown in FIG. 6. FIG. 8 shows a cross-sectional view taken along lines A—A of FIG. 7. FIG. 9 shows a cross-sectional view taken along lines B—B of FIG. 7.

First to third line patterns 105 to 107 in the mask pattern shown in FIG. 6 are patterns for forming wirings. The mask pattern of this kind is generally formed by using a commonly available CAD system. Resist patterns are formed by lithography using the mask pattern. A conductive layer is etched using the resist patterns as masks to form wiring layers. Then, the resist is removed by a known method. The wiring patterns obtained in this manner are shown in FIG. 7.

In the example shown in FIG. 7, a second wiring 115 is disposed in parallel with a first wiring 117. Further, a third wiring 116 is disposed in a direction perpendicular to the first wiring 117. Furthermore, one end of the second wiring 115 is connected to a contact section 130 formed in an interlayer dielectric layer 120. The contact section 130 is formed from a metal layer embedded in a via-hole 113. Also, one end of the third wiring 116 is connected to a contact section 132 embedded in a via hole 114. It is noted that, in FIG. 7, wirings in a layer lower than the wirings shown in the figure are not shown.

In the mask patterns that are used to form the first to third wirings having such patterns, as shown in FIG. 6, the second line pattern 105 is designed to extend to an extent to cover a via hole pattern 103 in such a manner that an end section of the second line pattern 105 generally concurs with an end section of the via hole pattern 103. Similarly, the third line pattern 106 is designed to extend to an extent to cover a via hole pattern 104 in such a manner that an end section of the third line pattern 106 generally concurs with an end section of the via hole pattern 104.

Incidentally, when wirings are formed by an etching method using resist patterns as masks, the following characteristic conditions take place. Namely, the wirings that are etched in a portion where the resist patterns are roughly formed become generally thicker than the resist patterns, and the wirings that are etched in a portion where the resist patterns are densely formed become generally thinner than the resist patterns. These conditions are shown in FIG. 8 and FIG. 9. FIG. 8 shows the condition that occurs when the patterns are rough. In this condition, when the etching is conducted, tapers are formed on the sides of the wiring 117. As a result, the width of the wiring 117 becomes wider than the width of the resist. FIG. 9 shows the condition where the wirings are not isolated. Under this condition, tapers are not formed on the opposing sides of the wiring 115 and the wiring 117.

Also, when resists are receded with further miniaturization of wiring patterns, there are instances where an overlap region between the contact section 130 in the via hole 113 and the second wiring 115 and an overlap region between the contact section 132 in the via hole 114 and the third wiring 116 become insufficient. As a result, problems may occur. For example, the contact resistances between the wirings 115 and 116 and the contact sections 130 and 132 may increase, the wiring reliability lowers, and so fourth.

Also, as shown in FIG. 7, since wiring patterns are not present adjacent to a region between the via holes 113 and 114 disposed on one side of the first wiring 117, a taper is formed on a side of the first wiring 117 as the etching is conducted, as shown in FIG. 8, and thus a bottom section of the wiring 117 becomes thicker than an upper section thereof. As a result, a protruded region 117a that is different from the resist pattern is formed in the first wiring 117. Due to the protruded region 117a, separations L1 and L2 between the wiring 117 and the contact sections 130 and 132 become smaller than the specified minimum inter-wiring separations. As a result, defects may occur in that the contact sections and the wirings become short-circuited.

As described above, in the conventional common semiconductor device, overlap regions between connection holes (via holes or contact holes) and wirings become insufficient as resists are receded with further miniaturization of patterns. This results in problems, such as, for example, the contact resistance between the wiring and the contact section embedded in the connection hole increase, and the wiring reliability lowers. Also, in regions where wiring patterns are roughly formed, wirings become wider than the corresponding resists due to tapers formed during the etching step. As a result, the thicker wiring sections may become short-circuited with contact sections formed nearby in a lower layer.

SUMMARY OF THE INVENTION

In accordance with the present invention, a semiconductor device that has a wiring pattern that is formed by etching a conductive layer using a resist pattern as a mask includes a contact section formed in an interlayer dielectric layer, a first wiring formed over the interlayer dielectric layer and disposed with a separation from the contact section shorter than a specified separation, and a second wiring having a connection region to be connected to the contact section, wherein the second wiring has an extension section extending in a non-wiring region in the connection region to be connected to the contact section, and the extension section is disposed in at least one section of the connection region other than sides thereof facing the first wiring.

In the semiconductor device in accordance with the present invention, since the extension section is provided in the connection region to be connected to the contact section, the connection region of the wiring can almost completely cover the contact section in the lower layer. Therefore, the contact resistance between the contact section formed in the connection hole (contact hole or via hole) and the wiring can be made small, the wiring reliability can be improved.

A variety of embodiments may be provided for the semiconductor device of the present invention as described below. These embodiments are applicable to semiconductor devices having structures to be described below.

(a) The separation is shorter than a specified separation and there is a minimum separation between wirings in a wiring pattern (hereafter referred to as a "minimum inter-wiring separation"). The minimum inter-wiring separation may vary depending on the design rules, and may be, for example, 0.1 μm or greater but 1 μm or smaller.

(b) The connection region is square in its plan configuration having dimensions that are greater than or equal to dimensions of the contact section.

(c) The extension section may preferably have the same width as the width of the wiring, and may preferably have the same extension length as the width of the wiring. Also, the extension section may preferably be square in its plan configuration.

Furthermore, semiconductor device in accordance with the present invention can have the following structures.

(1) A semiconductor device includes
a contact section formed in an interlayer dielectric layer,
a first wiring formed over the interlayer dielectric layer and disposed with a minimum inter-wiring separation with respect to the contact section, and
a second wiring having a connection region to be connected to the contact section and extending in parallel with the first wiring,
wherein the connection region of the second wiring has a generally square plan configuration,
the second wiring has an extension section extending in a non-wiring region in the connection region, and
the extension section is disposed on sides of the connection region other than sides thereof facing the first wiring.

(2) A semiconductor device includes
a contact section formed in an interlayer dielectric layer,
a first wiring formed over the interlayer dielectric layer and disposed with a minimum inter-wiring separation with respect to the contact section, and
a second wiring having a connection region to be connected to the contact section and extending in a direction perpendicular to the first wiring,
wherein the connection region of the second wiring has a generally square plan configuration,
the second wiring has an extension section extending in a non-wiring region in the connection region, and
the extension section is disposed on sides of the connection region other than sides thereof facing the first wiring.

(3) A semiconductor device includes
a contact section formed in an interlayer dielectric layer,
a first wiring formed over the interlayer dielectric layer and disposed with a minimum inter-wiring separation with respect to the contact section, and
a second wiring having a connection region to be connected to the contact section and having a section extending in parallel with the first wiring and a section extending in a direction perpendicular to the first wiring,
wherein the connection region of the second wiring has a generally square plan configuration,
the second wiring has an extension section extending in a non-wiring region in the connection region, and
the extension section is disposed on sides of the connection region other than sides thereof facing the first wiring.

(4) A semiconductor device includes
a contact section formed in an interlayer dielectric layer,
a first wiring formed over the interlayer dielectric layer and disposed with a minimum inter-wiring separation with respect to the contact section, and
a second wiring having only a connection region to be connected to the contact section,
wherein the connection region of the second wiring has a generally square plan configuration,
the second wiring has an extension section extending in a non-wiring region in the connection region, and
the extension section is disposed on sides of the connection region other than sides thereof facing the first wiring.

(5) A semiconductor device includes
a contact section formed in an interlayer dielectric layer,
a plurality of first wirings formed over the interlayer dielectric layer and disposed with a minimum inter-wiring separation with respect to the contact section, and
a second wiring having at least one connection region to be connected to the contact section,
wherein the connection region of the second wiring has a generally square plan configuration,
the second wiring has an extension section extending in a non-wiring region in the connection region, and
the extension section is disposed on sides of the connection region other than sides thereof facing the plurality of first wirings.

(6) A semiconductor device includes
a contact section formed in an interlayer dielectric layer, and
a wiring having a connection region to be connected to the contact section,
wherein the connection region of the wiring has a generally square plan configuration, and
the wiring has an extension section extending in a non-wiring region in the connection region.

DETAILED DESCRIPTION OF THE INVENTION

Examples of typical patterns in accordance with the present invention are described below with reference to the accompanying drawings.

(First Embodiment)

Figure 1:
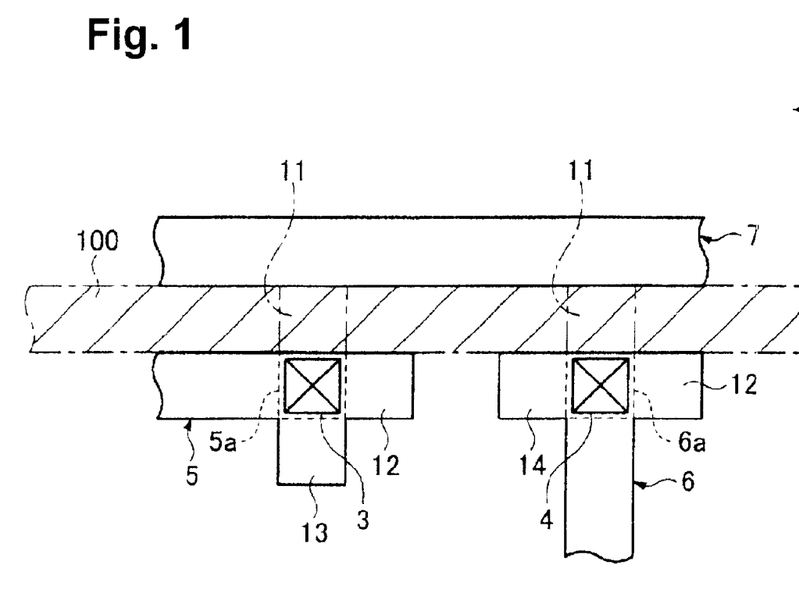
FIG. 1 shows a plan view of a mask pattern for forming wiring patterns in a semiconductor device in accordance with a first embodiment of the present invention.
Figure 2:
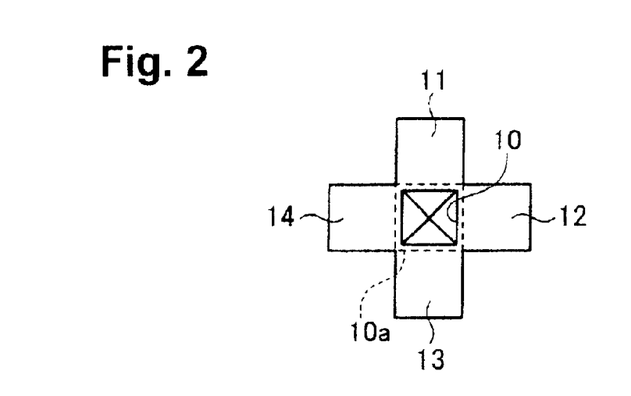
FIG. 2 shows a plan view for explaining a method for designing the mask pattern shown in FIG. 1.
Figure 3:
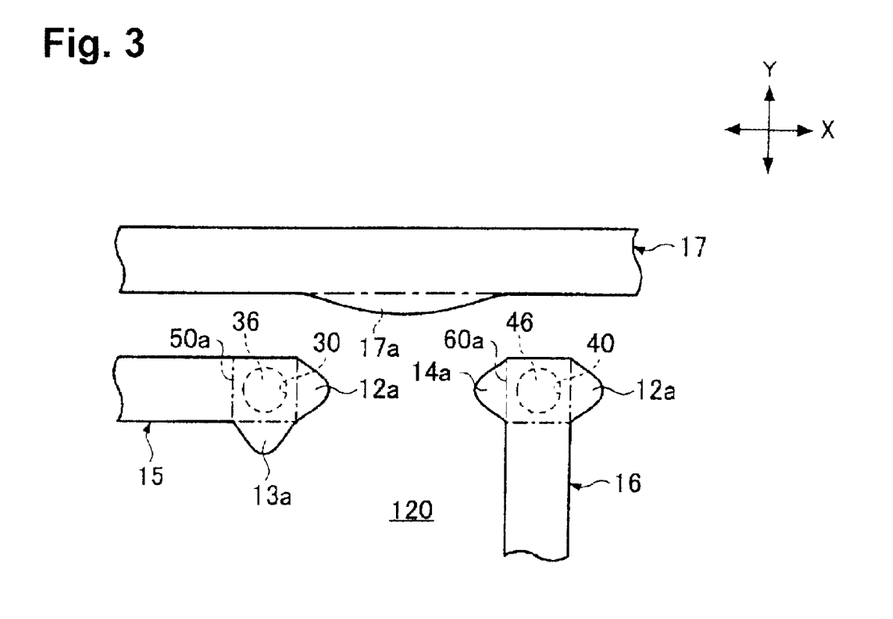
FIG. 3 shows a plan view of wiring patterns that are formed by photolithography technique and etching technique using the mask pattern shown in FIG. 1 as a mask.

FIG. 1 schematically shows a plan view of a mask pattern for forming wiring patterns in a semiconductor device in accordance with a first embodiment of the present invention. FIG. 2 shows a plan view for explaining a method for designing the mask pattern shown in FIG. 1. FIG. 3 shows a plan view of wiring patterns that are patterned using the mask pattern shown in FIG. 1 as a mask.

[Mask Pattern]

In the example of the this embodiment, a line pattern is disposed extending in an X direction and a plurality of line patterns each having a contact section are disposed adjacent to the line pattern extending in the X direction.

More particularly, a mask pattern shown in FIG. 1 has a first line pattern 7 and second line pattern 5 and third line pattern 6 disposed adjacent to the first line pattern 7. The first and second line patterns 7 and 5 both extend in the X direction, and the third line pattern 6 extends in the Y direction. Further, the second and third line patterns 5 and 6 are both separated from the first line pattern 7 by a separation shorter than a specified distance, more particularly, with a minimum inter-wiring separation.

Square connection region patterns 5a and 6a are formed at end sections of the second and third line patterns 5 and 6, respectively. The connection region patterns 5a and 6a each have a pattern that concurs with a square via hole pattern 3 or 4, or a pattern that is larger than the via hole pattern 3 or 4. Each of the connection region patterns 5a and 6a has extension patterns in non-wiring regions on its sides other than those sides that face the first line pattern 7.

In other words, the second line pattern 5 is formed with an extension pattern 12 extending in the X direction (to the right) and an extension pattern 13 extending in the Y direction (to the lower side) at two sides of the connection region pattern 5a. Also, the third line pattern 6 is formed with an extension pattern 12 extending in the X direction (to the right) and an extension pattern 14 extending in the X direction (to the left) at two sides of the connection region pattern 6a.

The extension patterns are not particularly limited to any specific shapes or sizes, as long as they can alleviate errors in the mask linearity that may occur when a resist pattern is formed by lithography or an etching is conducted, to thereby secure connection regions for the wirings. The extension pattern may preferably have a width that is the same as a line width of a line pattern, and its extension pattern may preferably have a width that is the same as a line width of a line pattern. In other words, each of the extension patterns may preferably have a square shape having sides each being the same as the width of the line pattern. When the extension patterns each have such a shape, the patterns can be readily designed and connection regions for wirings can be securely formed even under the influence of receded resist patterns. Features of the shapes and sizes of the extension patterns described above may similarly apply to other embodiments.

[Method for Designing Mask Patterns]

First, a method for designing the mask pattern shown in FIG. 1 is described.

(a) First, line patterns that are basic patterns of the wiring patterns are disposed, and connection region patterns that cover at least connection hole patterns in a lower layer and extension patterns on sides of the respective connection region patterns are disposed.

More particularly, for example, the first, second and third line patterns 5, 6 and 7 are disposed as shown in FIG. 1. Also, extension patterns are disposed at the connection region patterns 5a and 6a that at least cover the connection hole patterns 3 and 4 that overlap the line patterns.

When a connection region pattern 10a has a square shape corresponding to a square connection hole pattern 10, as shown in FIG. 2, first to fourth extension patterns 11 to 14 are disposed on sides of each of the connection region patterns, respectively.

(b) Furthermore, any extension patterns among the first to fourth extension patterns 11 to 14 that face line patterns that are separated from the sides of the connection region patterns 5a and 6a by a separation shorter than a specified separation (that is a minimum inter-wiring separation in this example) are erased.

More particularly, as shown in FIG. 1, a region 100 between the first line pattern 7 and the second and third line patterns 5 and 6 that are separated from one another by a minimum inter-wiring separation (i.e., a hatched region) is set as a region where the placement of extension patterns is prohibited. Therefore, among the extension patterns 11 to 14 of the connection region patterns 5a and 6a, the extension patterns 11 in the prohibited region 100 are erased. The design can be set such that any of the extension patterns that overlap the line patterns are erased or ignored.

[Method for Manufacturing Semiconductor Device]

A resist pattern is formed by a known lithography technique using the mask pattern obtained by the method described above. For example, a series of process steps including coating resist on a substrate or an interlayer dielectric layer, drawing patterns based on drawing data that uses the mask patterns, developing and removing the resist are conducted to form a resist pattern.

Further, a conductive layer is etched using the resist pattern thus obtained as a mask to form wiring patterns.

[Semiconductor Device]

FIG. 3 shows an example of wiring patterns of a semiconductor device that is obtained by the manufacturing method described above.

In the semiconductor device shown in FIG. 3, the wiring patterns are formed over an interlayer dielectric layer 120. The wiring patterns include wirings and extension sections respectively corresponding to the line patterns and the extension patterns of the mask pattern shown in FIG. 1. The shape of each of the sections will be described below.

Contact sections 36 and 46 that are formed from metal layers embedded in via holes 30 and 40 are formed in the interlayer dielectric layer 120. It is noted that, when a via hole is reduced in diameter to a certain level, corners of a via hole pattern are rounded due to the light approximation effect and has a generally circular plan shape.

In the example shown in the figure, a first wiring 17 is disposed separated from the contact sections 36 and 46 by a separation shorter than a specified separation (about a minimum inter-wiring separation in this example). A second wiring 15 and the third wiring 16 are disposed in proximity to the first wiring 17. The first and second wirings 17 and 15 both extend in the X direction, and a third wiring 16 extends in the Y direction. Also, the second and third wirings 15 and 16 are disposed separated from the first wiring 17 by a minimum inter-wiring separation.

Connection regions 50a and 60a are formed at end sections of the second and third wirings 15 and 16, respectively. Each of the connection regions 50a and 60a has a pattern that overlaps each of the via holes 30 and 40, respectively. Each of the connection regions 50a and 60a has extension sections in non-wiring regions on its sides other than those sides that face the first wiring 17.

In other words, the second wiring 15 is formed with an extension section 12a extending in the X direction (to the right) and an extension section 13a extending in the Y direction (to the lower side) at two sides of the connection region 50a. Also, the third wiring 16 is formed with an extension section 12a extending in the X direction (to the right) and an extension section 14a extending in the X direction (to the left) at two sides of the connection section 60a. It is difficult to precisely reflect the shapes of the extension patterns of the mask pattern on the respective extension sections due to the receded resist layer resulted from further miniaturization of patterns. However, the wirings can almost completely cover the contact sections 36 and 46 in a lower layer at least in the connection regions 50a and 60a. As a result, the contact resistance between the contact sections formed in the via holes and the wirings can be reduced and the reliability of the wirings can be increased.

Furthermore, in the present embodiment, the second and third line patterns 5 and 6 have the extension patterns 12 and 14 extending in the X direction, as shown in FIG. 1. Therefore, line patterns are more densely formed with respect to the first line pattern 7 compared to the case where the extension patterns 12 and 14 are not provided. As a result, a protruded section 17a that is formed on the first wiring 17 shown in FIG. 3 in the etching process can be reduced in width. Accordingly, errors in the mask linearity due to different pattern densities can be alleviated and wirings can be patterned with a higher precision. Furthermore, short-circuit between the wirings and between the wirings and the contact sections can be prevented.

(Second Embodiment)

Figure 4:
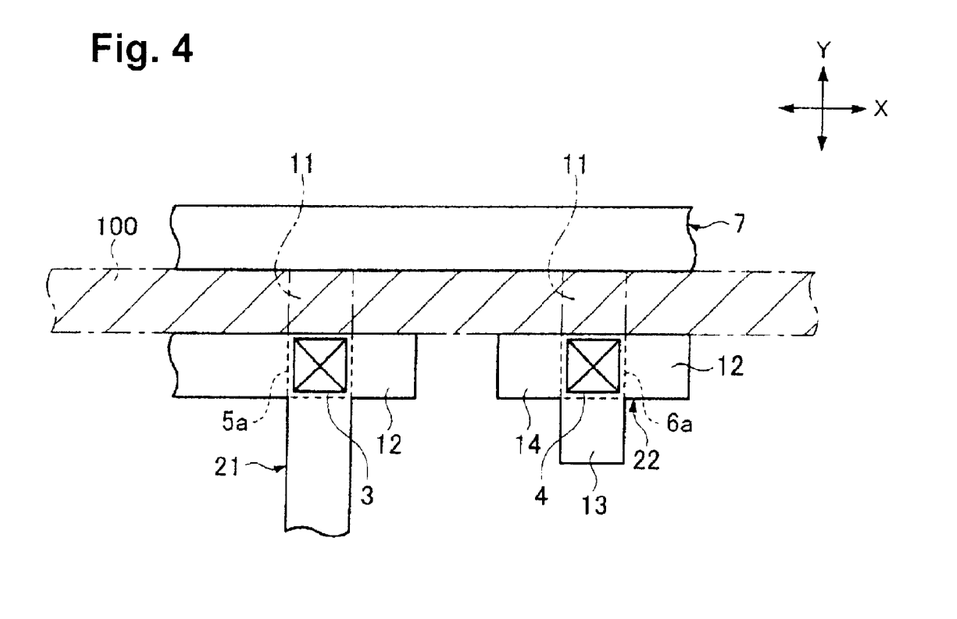
FIG. 4 shows a plan view of a mask pattern for forming wiring patterns in a semiconductor device in accordance with a second embodiment of the present invention.
Figure 5:
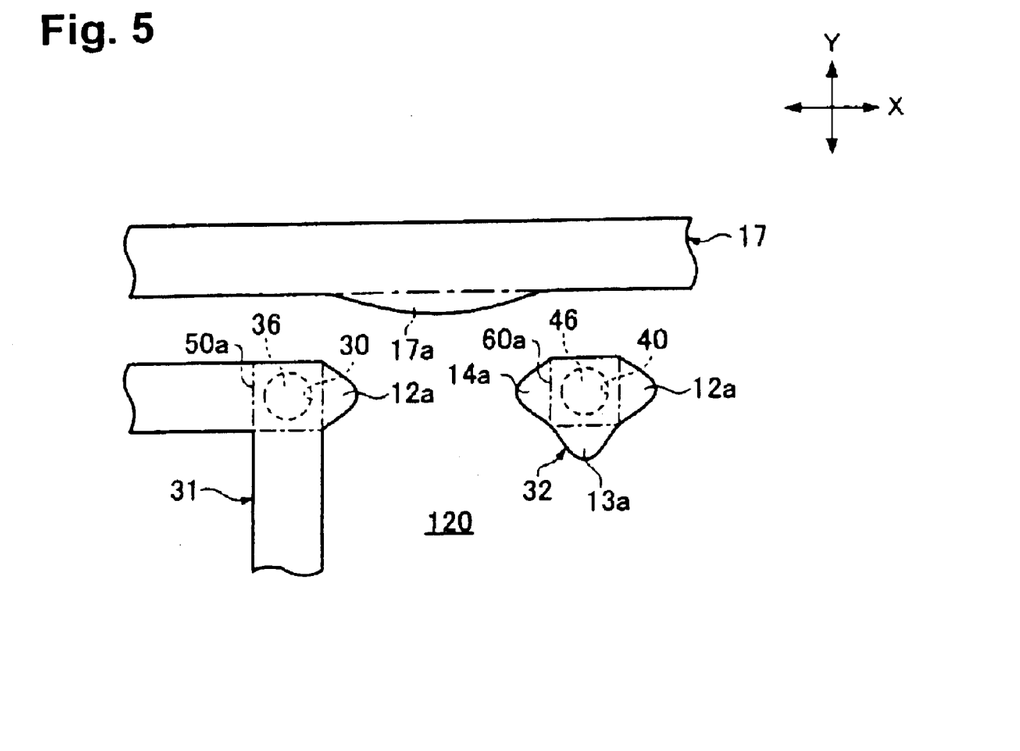
FIG. 5 shows a plan view of wiring patterns that are formed by photolithography technique and etching technique using the mask pattern shown in FIG. 4 as a mask.

FIG. 4 schematically shows a plan view of a mask pattern for forming wiring patterns in a semiconductor device in accordance with a second embodiment of the present invention. FIG. 5 shows a plan view of wiring patterns that are patterned using the mask pattern shown in FIG. 4. Sections of this embodiment that have substantially the same functions as those of the first embodiment are described with the same reference numbers.

[Mask Pattern]

In this embodiment, line patterns having contact sections are different in shape from the line patterns of the first embodiment. More particularly, this embodiment shows an example in which a line pattern extending in the X direction is provided, and another line pattern having a contact section and a line pattern composed only of a contact section are disposed adjacent to the line pattern extending in the X direction.

More particularly, a mask pattern shown in FIG. 4 has a first line pattern 7 and second line pattern 21 and third line pattern 22 disposed adjacent to the first line pattern 7. The first line pattern 7 extends in the X direction, and the second line pattern 21 extends in the Y direction. The third line pattern 22 does not have a pattern that extends as a wiring. Further, the second and third line patterns 21 and 22 are both separated from the first line pattern 7 by a separation shorter than a specified distance, more particularly, with a minimum inter-wiring separation.

Square connection region patterns 5a and 6a are formed at end sections of the second and third line patterns 21 and 22, respectively. Each of the connection region patterns 5a and 6a has a pattern that concurs with each of square via hole patterns 3 and 4 or a pattern that is larger than each of the via hole patterns 3 and 4, respectively. Each of the connection region patterns 5a and 6a has extension patterns in non-wiring regions on its sides other than those sides that face the first line pattern 7.

In other words, the second line pattern 21 is formed with an extension pattern 12 extending in the X direction (to the right) at one side of the connection region pattern 5a. Also, the third line pattern 22 is formed with an extension pattern 12 extending in the X direction (to the right), an extension pattern 13 extending in the Y direction (to the lower side) and an extension pattern 14 extending in the X direction (to the left) at three sides of the connection region pattern 6a.

[Method for Designing Mask Patterns]

Next, a method for designing the mask pattern shown in FIG. 4 is described. The designing method is basically the same as the designing method described in the first embodiment.

(a) First, line patterns that are basic patterns of the wiring patterns are disposed, and connection region patterns that cover at least connection hole patterns in a lower layer and extension patterns on sides of the respective connection region patterns are disposed.

More particularly, for example, the first, second and third line patterns 7, 21 and 22 are disposed as shown in FIG. 4. Also, extension patterns are disposed at the connection region patterns 5a and 6a that at least cover the connection hole patterns 3 and 4 that overlap the line patterns. As shown in FIG. 2, first to fourth extension patterns 11 to 14 are disposed on sides of each of the square connection region patterns, respectively.

(b) Furthermore, any extension patterns among the first to fourth extension patterns 11 to 14 that face line patterns that are separated from the sides of the connection region patterns 5a and 6a by a separation shorter than a specified separation (that is a minimum inter-wiring separation in this example) are erased.

More particularly, as shown in FIG. 4, a region 100 between the first line pattern 7 and the second and third line patterns 21 and 22 that are separated from one another by a minimum inter-wiring separation (i.e., a hatched region) is set as a region where the placement of extension patterns is prohibited. Therefore, among the extension patterns 11 to 14 of the connection region patterns 5a and 6a, the extension patterns 11 in the prohibited region 100 are erased. The design can be set such that any of the extension patterns that overlap the line patterns are erased or ignored.

[Method for Manufacturing Semiconductor Device]

The same method for manufacturing a semiconductor device in accordance with the first embodiment is applied. More particularly, a resist pattern is formed by a known lithography technique using the mask pattern obtained by the method described above. Further, a conductive layer is etched using the resist pattern thus obtained as a mask to form wiring patterns.

[Semiconductor Device]

FIG. 5 shows an example of wiring patterns of a semiconductor device that is obtained by the manufacturing method described above.

In the semiconductor device shown in FIG. 5, the wiring patterns are formed over an interlayer dielectric layer 120. The wiring patterns include wirings and extension sections respectively corresponding to the line patterns and the extension patterns of the mask pattern shown in FIG. 4. The shape of each of the sections will be described below.

Via holes 30 and 40 and contact sections 36 and 46 are formed in the same manner as the first embodiment.

In the example shown in the figure, a first wiring 17 is disposed separated from the contact sections 36 and 46 by a separation shorter than a specified separation (about a minimum inter-wiring separation in this example). A second wiring 31 and a third wiring 32 are disposed in proximity to the first wiring 17. The first wiring 17 extends in the X direction, and the second wiring 31 extends in the X direction and the Y direction. The third wiring 32 is composed only of a contact region for connecting upper and lower contact sections. Also, the second and third wirings 31 and 32 are disposed separated from the first wiring 17 by a minimum inter-wiring separation.

The second and third wirings 31 and 32 have connection regions 50a and 60a formed at end sections thereof, respectively. The connection regions 50a and 60a overlap the contact sections 36 and 46 within the via holes 30 and 40, respectively. Each of the connection regions 50a and 60a has extension sections in non-wiring regions on its sides other than those sides that face the first wiring 17.

In other words, the second wiring 31 is formed with an extension section 12a extending in the X direction (to the right) at one side of the connection region 50a. Also, the third wiring 32 is formed with an extension section 12a extending in the X direction (to the right), an extension section 13a extending in the Y direction (to the lower side) and an extension section 14a extending in the X direction (to the left) at three sides of the connection section 60a. It is difficult to exactly reflect the shapes of the extension patterns of the mask pattern on the respective extension sections due to the receded resist layer resulted from further miniaturization of patterns. However, the wirings can almost completely cover the contact sections 36 and 46 in a lower layer at least in the connection regions 50a and 60a. As a result, the contact resistance between the contact sections formed in the via holes and the wirings can be reduced and the reliability of the wirings can be increased.

Furthermore, in the present embodiment, the second and third line patterns 21 and 22 have the extension patterns 12 and 12 extending in the X direction, as shown in FIG. 4. Therefore, line patterns are more densely formed with respect to the first line pattern 7 compared to the case where these extension patterns 12 are not provided. As a result, a protruded section 17a that is formed on the first wiring 17 shown in FIG. 5 in the etching process can be reduced in width. Accordingly, errors in the mask linearity due to different pattern densities can be alleviated and wirings can be patterned with a higher precision. Furthermore, short-circuit between the wirings and between the wirings and the contact sections can be prevented.

(Third Embodiment)

Figure 10:
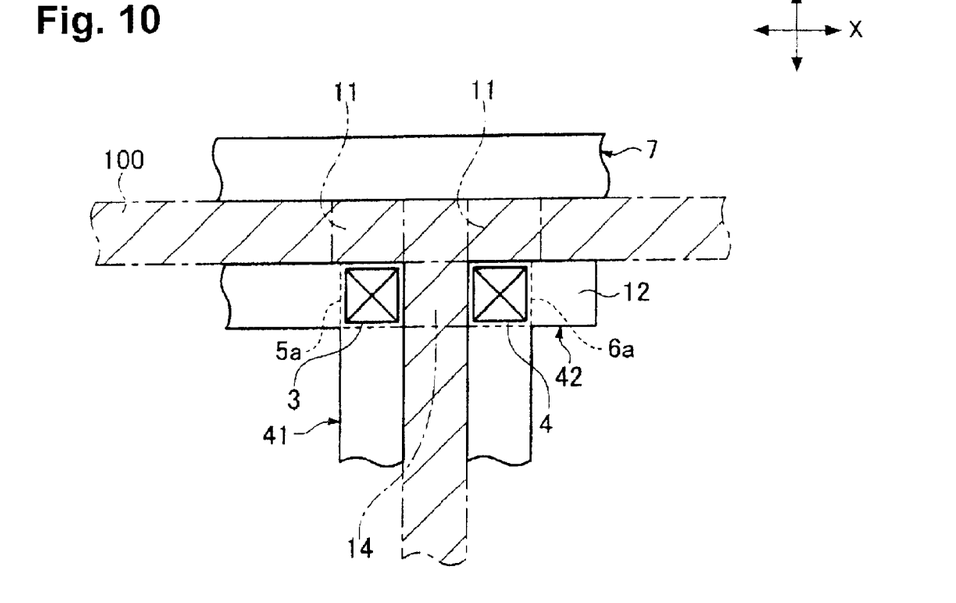
FIG. 10 shows a plan view of a mask pattern for forming wiring patterns in a semiconductor device in accordance with a third embodiment of the present invention.
Figure 11:
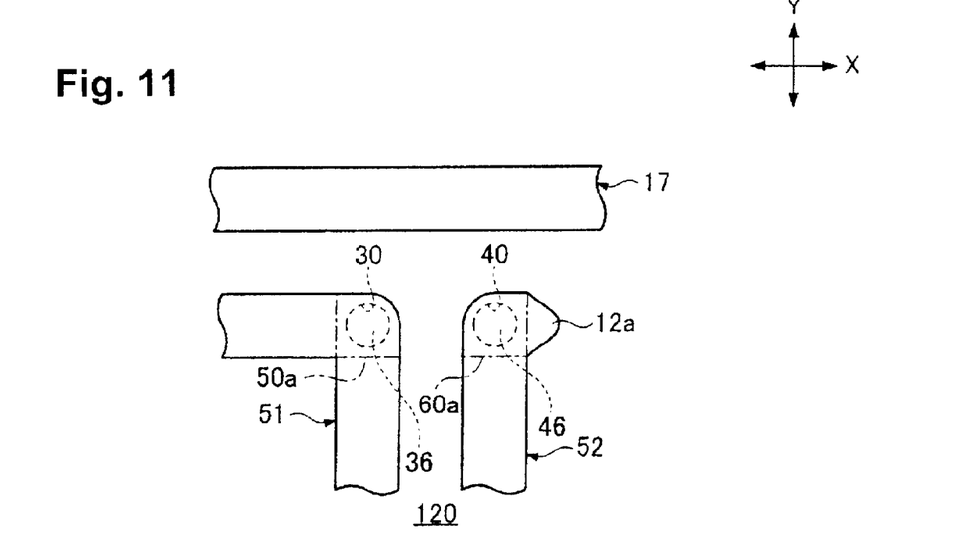
FIG. 11 shows a plan view of wiring patterns that are formed by photolithography technique and etching technique using the mask pattern shown in FIG. 10 as a mask.

FIG. 10 schematically shows a plan view of a mask pattern for forming wiring patterns in a semiconductor device in accordance with a third embodiment of the present invention. FIG. 11 shows a plan view of wiring patterns that are patterned using the mask pattern shown in FIG. 10.

Sections of this embodiment that have substantially the same functions as those of the first embodiment are described with the same reference numbers.

[Mask Pattern]

In this embodiment, line patterns having contact sections are different in shape from the line patterns of the first embodiment. More particularly, this embodiment shows an example in which a line pattern extending in the X direction is provided, and a plurality of line patterns each having a contact section are disposed adjacent to the line pattern extending in the X direction.

More particularly, a mask pattern shown in FIG. 10 has a first line pattern 7 and second line pattern 41 and third line pattern 42 disposed adjacent to the first line pattern 7. The first line pattern 7 extends in the X direction, and the second line pattern 41 extends in the X direction and the Y direction. The third line pattern 42 extends in the Y direction. Further, the second and third line patterns 41 and 42 are both separated from the first line pattern 7 by a separation shorter than a specified distance, more particularly, with a minimum inter-wiring separation. Furthermore, the second line pattern 41 and the third line pattern 42 are disposed separated from each other by a minimum inter-wiring separation.

Square connection region patterns 5a and 6a are formed at end sections of the second and third line patterns 41 and 42, respectively. Each of the connection region patterns 5a and 6a has a pattern that concurs with each of square via hole patterns 3 and 4 or a pattern that is larger than each of the via hole patterns 3 and 4, respectively. The connection region pattern 6a has extension patterns in non-wiring regions on its sides other than the sides that face the first line pattern 7 or the second line pattern 41. On the other hand, the connection region pattern 5a does not have extension patterns because non-wiring regions are present in prohibited regions 100. The prohibited regions 100 are described below.

In other words, the second line pattern 41 does not have any extension patterns formed on sides of the connection region pattern 5a. The third line pattern 42 has an extension pattern 12 extending in the X direction (to the right) formed at one side of the connection region pattern 6a.

[Method for Designing Mask Patterns]

Next, a method for designing the mask pattern shown in FIG. 10 is described. The designing method is basically the same as the designing method described in the first embodiment.

(a) First, line patterns that are basic patterns of the wiring patterns are disposed, and connection region patterns that cover at least connection hole patterns in a lower layer and extension patterns on sides of the respective connection region patterns are disposed.

More particularly, for example, the first, second and third line patterns 7, 41 and 42 are disposed as shown in FIG. 10. Also, extension patterns are disposed at the connection region patterns 5a and 6a that at least cover the connection hole patterns 3 and 4 that overlap the line patterns. As shown in FIG. 2, first to fourth extension patterns 11 to 14 are disposed on sides of each of the square connection region patterns, respectively.

(b) Furthermore, any extension patterns among the first to fourth extension patterns 11 to 14 that face line patterns that are separated from the sides of the connection region patterns 5a and 6a by a separation shorter than a specified separation (that is a minimum inter-wiring separation in this example) are erased.

More particularly, as shown in FIG. 10, a region 100 between the first line pattern 7 and the second and third line patterns 41 and 42 that are separated from one another by a minimum inter-wiring separation (i.e., a hatched region) is set as a region where the placement of extension patterns is prohibited. Therefore, among the extension patterns 11 to 14 of the connection region patterns 5a and 6a, the extension patterns 11 and 14 in the prohibited region 100 are erased. The design can be set such that any of the extension patterns that overlap the line patterns are erased or ignored.

[Method for Manufacturing Semiconductor Device]

The same method for manufacturing a semiconductor device in accordance with the first embodiment is applied. More particularly, a resist pattern is formed by a known lithography technique using the mask pattern obtained by the method described above. Further, a conductive layer is etched using the resist pattern thus obtained as a mask to form wiring patterns.

[Semiconductor Device]

FIG. 11 shows an example of wiring patterns of a semiconductor device that is obtained by the manufacturing method described above.

In the semiconductor device shown in FIG. 11, the wiring patterns are formed over an interlayer dielectric layer 120. The wiring patterns include wirings and extension sections respectively corresponding to the line patterns and the extension patterns of the mask pattern shown in FIG. 10. The shape of each of the sections will be described below.

Via holes 30 and 40 and contact sections 36 and 46 are formed in the same manner as the first embodiment.

In the example shown in the figure, a first wiring 17 is disposed separated from the contact sections 36 and 46 by a separation shorter than a specified separation (about a minimum inter-wiring separation in this example). A second wiring 51 and a third wiring 52 are disposed in proximity to the first wring 17. The first wiring 17 extends in the X direction, the second wiring 51 extends in the X direction and the Y direction, and the third wiring 52 extends in the Y direction. The second and third wirings 51 and 52 are both disposed separated from the first wiring 17 by a minimum inter-wiring separation. Also, the second and third wirings 51 and 52 are disposed separated from each other by a minimum inter-wiring separation.

The second and third wirings 51 and 52 have connection regions 50a and 60a formed at end sections thereof, respectively. The connection regions 50a and 60a overlap the contact sections 36 and 46 within the via holes 30 and 40, respectively. The connection region 60a has an extension section in non-wiring regions on its side other than those sides in the prohibited regions 100 (see FIG. 10).

In other words, the second wiring 51 does not have any extension sections at any sides of the connection region 50a. The third wiring 52 is formed with an extension section 12a extending in the X direction (to the right) at one side of the connection region 60a. It is difficult to exactly reflect the shapes of the extension patterns of the mask pattern on the respective extension sections due to the receded resist layer resulted from further miniaturization of patterns. However, the wirings can almost completely cover the contact section 46 in a lower layer at least in the connection region 60a. As a result, the contact resistance between the contact sections formed in the via holes and the wirings can be reduced and the reliability of the wirings can be increased.

It is noted that, in the present embodiment, the second and third line patterns 41 and 42 are separated from each other by a minimum wiring width, and therefore substantially no extended section may be formed on the first wiring 17 due to etching.

(Fourth Embodiment)

Figure 12:
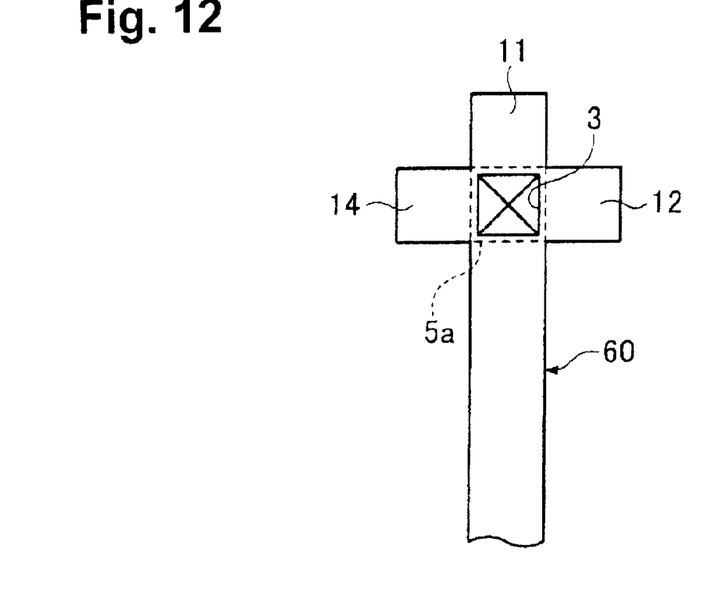
FIG. 12 shows a plan view of a mask pattern for forming wiring patterns in a semiconductor device in accordance with a fourth embodiment of the present invention.
Figure 13:
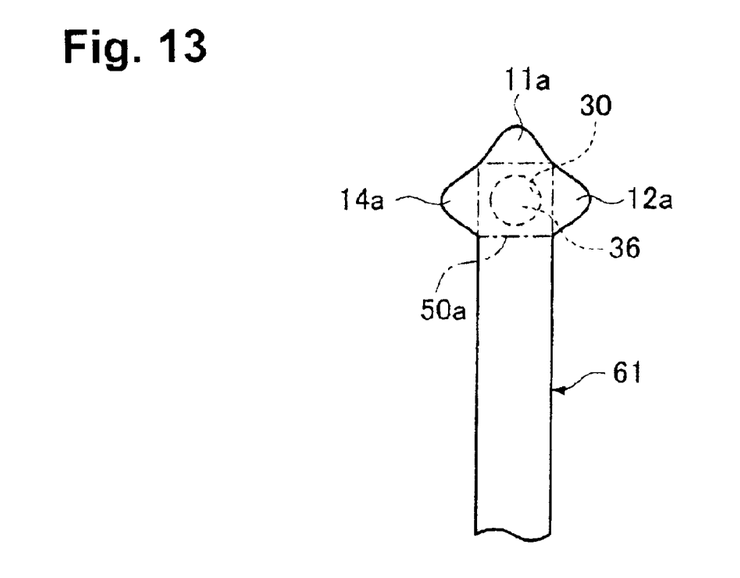
FIG. 13 shows a plan view of wiring patterns that are formed by photolithography technique and etching technique using the mask pattern shown in FIG. 12 as a mask.

FIG. 12 schematically shows a plan view of a mask pattern for forming wiring patterns in a semiconductor device in accordance with a fourth embodiment of the present invention. FIG. 13 shows a plan view of wiring patterns that are patterned using the mask pattern shown in FIG. 12. Sections of this embodiment that have substantially the same functions as those of the first embodiment are described with the same reference numbers.

[Mask Pattern]

In this embodiment, an isolated line pattern having a contact section is shown. More particularly, in the mask pattern shown in FIG. 12, a line pattern 60 is formed with a square connection region pattern 5a at one end thereof. The connection region pattern 5a has a pattern that concurs with a square via hole pattern 3 or a pattern that is larger than the via hole pattern 3. The connection region pattern 5a has extension patterns 11, 12 and 14 on three sides thereof.

[Method for Designing Mask Pattern]

Next, a method for designing the mask pattern shown in FIG. 12 is described. The designing method is basically the same as the designing method described in the first embodiment.

(a) First, line patterns that are basic patterns of the wiring patterns are disposed, and connection region patterns that cover at least connection hole patterns in a lower layer and extension patterns on sides of the respective connection region patterns are disposed.

More particularly, for example, the line pattern 60 is disposed as shown in FIG. 12. Also, extension patterns are disposed at the connection region pattern 5a that at least covers the connection hole pattern 3 that overlaps the line pattern. As shown in FIG. 2, first to fourth extension patterns 11 to 14 are disposed on sides of the square connection region pattern.

(b) Furthermore, any extension patterns among the first to fourth extension patterns 11 to 14 that face line patterns that are separated from the sides of the connection region pattern 5a by a separation shorter than a specified separation (that is a minimum inter-wiring separation in this example) are erased. In this embodiment, the line pattern 60 is isolated, and therefore no prohibited region is present around the connection region pattern 5a. Therefore, the extension patterns 11, 12 and 13 except the extension pattern that overlaps the line pattern are disposed.

[Method for Manufacturing Semiconductor Device]

The same method for manufacturing a semiconductor device in accordance with the first embodiment is applied. More particularly, a resist pattern is formed by a known lithography technique using the mask pattern obtained by the method described above. Further, a conductive layer is etched using the resist pattern thus obtained as a mask to form wiring patterns.

[Semiconductor Device]

FIG. 13 shows an example of wiring patterns of a semiconductor device that is obtained by the manufacturing method described above.

In the semiconductor device shown in FIG. 13, the wiring patterns are formed over an interlayer dielectric layer 120. The wiring patterns include wirings and extension sections respectively corresponding to the line patterns and the extension patterns of the mask pattern shown in FIG. 12. In the example shown in the figure, a wiring 61 has a square connection region 50a formed at an end section thereof. The connection region 50a has extension sections 11a, 12a and 14a on its three sides.

It is difficult to exactly reflect the shapes of the extension patterns of the mask pattern on the respective extension sections due to the receded resist layer resulted from further miniaturization of patterns. However, the wiring can almost completely cover the contact section 36 in a lower layer at least in the connection region 50a. As a result, the contact resistance between the contact section formed in the via hole and the wiring can be reduced and the reliability of the wiring can be increased.

(Fifth Embodiment)

Figure 14:
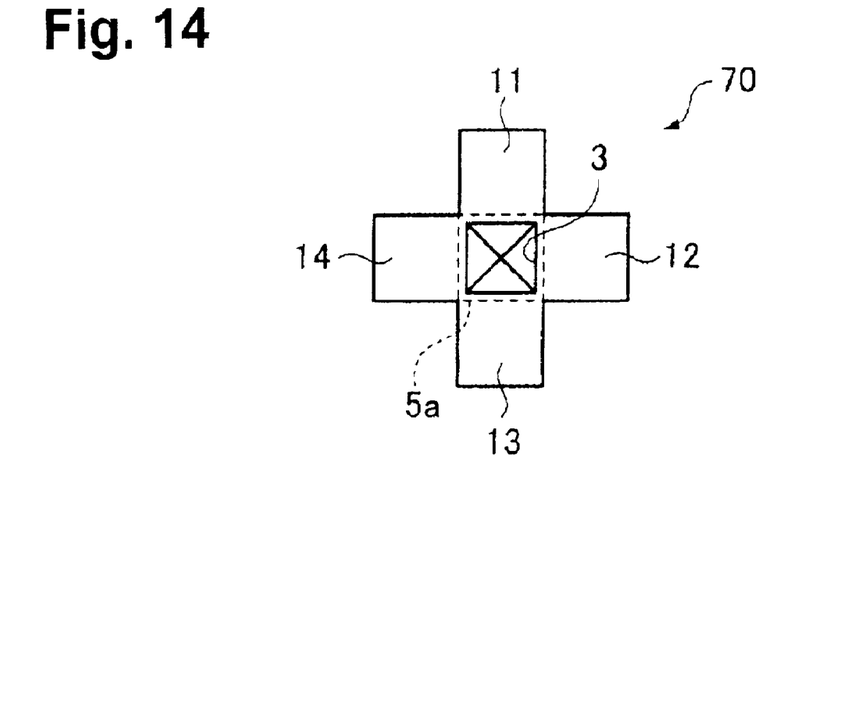
FIG. 14 shows a plan view of a mask pattern for forming wiring patterns in a semiconductor device in accordance with a fifth embodiment of the present invention.
Figure 15:
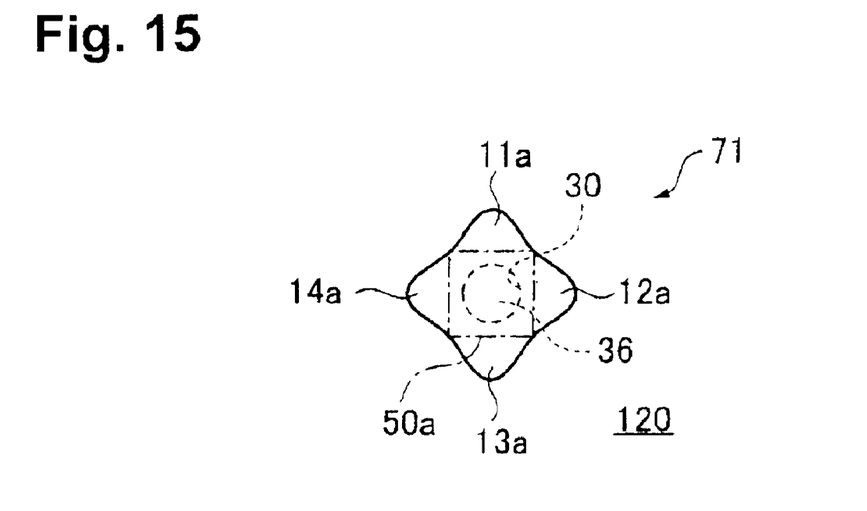
FIG. 15 shows a plan view of wiring patterns that are formed by photolithography technique and etching technique using the mask pattern shown in FIG. 14 as a mask.

FIG. 14 schematically shows a plan view of a mask pattern for forming wiring patterns in a semiconductor device in accordance with a fourth embodiment of the present invention. FIG. 15 shows a plan view of wiring patterns that are patterned using the mask pattern shown in FIG. 14. Sections of this embodiment that have substantially the same functions as those of the first embodiment are described with the same reference numbers.

[Mask Pattern]

In this embodiment, an isolated line pattern composing only a contact section is shown. More particularly, in the mask pattern shown in FIG. 14, a line pattern 70 is formed from a square connection region pattern 5a. The connection region pattern 5a has a pattern that concurs with a square via hole pattern 3 or a pattern that is larger than the via hole pattern 3. The connection region pattern 5a has extension patterns 11, 12, 13 and 14 on four sides thereof

[Method for Designing Mask Patterns]

Next, a method for designing the mask pattern shown in FIG. 14 is described. The designing method is basically the same as the designing method described in the first embodiment.

(a) First, line patterns that are basic patterns of the wiring patterns are disposed, and connection region patterns that cover at least connection hole patterns in a lower layer and extension patterns on sides of the respective connection region patterns are disposed.

More particularly, for example, the line pattern 70 is disposed as shown in FIG. 14. Also, extension patterns are disposed at the connection region pattern 5a that at least covers the connection hole pattern 3 that overlaps the line pattern. As shown in FIG. 2, first to fourth extension patterns 11 to 14 are disposed on sides of the square connection region pattern.

(b) Furthermore, any extension patterns among the first to fourth extension patterns 11 to 14 that face line patterns that are separated from the sides of the connection region pattern 5a by a separation shorter than a specified separation (that is a minimum inter-wiring separation in this example) are erased. In this embodiment, the line pattern 70 is isolated, and therefore no prohibited region is present around the connection region pattern 5a. Therefore, the extension patterns 11~14 are disposed at the four sides of the connection region pattern 5a.

[Method for Manufacturing Semiconductor Device]

The same method for manufacturing a semiconductor device in accordance with the first embodiment is applied. More particularly, a resist pattern is formed by a known lithography technique using the mask pattern obtained by the method described above. Further, a conductive layer is etched using the resist pattern thus obtained as a mask to form wiring patterns.

[Semiconductor Device]

FIG. 14 shows an example of wiring patterns of a semiconductor device that is obtained by the manufacturing method described above.

In the semiconductor device shown in FIG. 14, the wiring patterns are formed over an interlayer dielectric layer 120. The wiring patterns include wirings and extension sections respectively corresponding to the line patterns and the extension patterns of the mask pattern shown in FIG. 12. In the example shown in the figure, a wiring 71 is formed from a square connection region 50a. The connection region 50a has extension sections 11a, 12a, 13a and 14a on its four sides.

It is difficult to exactly reflect the shapes of the extension patterns of the mask pattern on the respective extension sections due to the receded resist layer resulted from further miniaturization of patterns. However, the wiring 71 can almost completely cover the contact section 36 in a lower layer at least in the connection region 50a. As a result, the contact resistance between the contact section formed in the via hole and the wiring can be reduced and the reliability of the wiring can be increased.

Semiconductor devices in accordance with the typical embodiments of the present are described above. However, the present invention is not limited to these embodiments and a variety of modifications can be made within the scope of the subject matter of the present invention.

What is claimed is:

1. A semiconductor device having a wiring pattern that is formed by etching a conductive layer using a resist pattern as a mask, the semiconductor device comprising:

a contact section formed in an interlayer dielectric layer;

a first wiring formed over the interlayer dielectric layer and disposed with a separation from the contact section shorter than a predetermined separation; and a second wiring having a connection region connected to the contact section, wherein the second wiring has an extension section, which extends from a side of the connection region in a non-wiring region, and the extension section extends from at least one section of the connection region other than sides of the connection region facing the first wiring, wherein the extension section does not extend from the side of the connection region facing the first wiring.

2. The semiconductor device according to claim 1, wherein there is a minimum separation between wirings in the wiring pattern.

3. The semiconductor device according to claim 1, wherein the connection region is square in its plan configuration having dimensions that are greater than or equal to dimensions of the contact section.

4. The semiconductor device according to claim 1, wherein the extension section has an identical width as a width of the wiring.

5. The semiconductor device according to claim 1, wherein the extension section has an extension length identical with the width of the wiring.

6. The semiconductor device according to claim 1, wherein the extension section is square in its plan configuration.

7. The semiconductor device according to claim 1, wherein the connection region has a first side and a second side that faces the first wiring, and wherein the extension section extends from at least the first side of the connection region and does not extend from the second side.

8. A semiconductor device having a wiring pattern formed by etching a conductive layer using a resist pattern as a mask, the semiconductor device comprising:

a contact section formed in an interlayer dielectric layer;

a first wiring formed over the interlayer dielectric layer and disposed with a predetermined inter-wiring separation with respect to the contact section; and a second wiring having a connection region to be connected to the contact section and extending in parallel with the first wiring, wherein the connection region of the second wiring has a generally square plan configuration, the second wiring has an extension section extending in a non-wiring region in the connection region, and the extension section does not extend from sides of the connection region facing the first wiring.

9. The semiconductor device according to claim 8, wherein the separation is shorter than a specified separation and there is a minimum separation between wirings in the wiring pattern.

10. The semiconductor device according to claim 8, wherein the connection region is square in its plan configuration having dimensions that are greater than or equal to dimensions of the contact section.

11. The semiconductor device according to claim 8, wherein the extension section has an identical width as a width of the wiring.

12. The semiconductor device according to claim 8, wherein the extension section has an extension length identical with the width of the wiring.

13. The semiconductor device according to claim 8, wherein the connection region has a first side and a second side that faces the first wiring, and wherein the extension section is disposed on at least the first side of the connection region and is not disposed on the second side.

14. A semiconductor device having a wiring pattern formed by etching a conductive layer using a resist pattern as a mask, the semiconductor device comprising:

a contact section formed in an interlayer dielectric layer;

a first wiring formed over the interlayer dielectric layer and disposed with a predetermined inter-wiring separation with respect to the contact section; and a second wiring having a connection region to be connected to the contact section and extending in a direction perpendicular to the first wiring, wherein the connection region of the second wiring has a generally square plan configuration, the second wiring has an extension section extending in a non-wiring region in the connection region, and the extension section does not extend from a sides of the connection region facing the first wiring.

15. The semiconductor device according to claim 14, wherein the separation is shorter than a specified separation and there is a minimum separation between wirings in the wiring pattern.

16. The semiconductor device according to claim 14, wherein the connection region is square in its plan configuration having dimensions that are greater than or equal to dimensions of the contact section.

17. The semiconductor device according to claim 14, wherein the connection region has a first side and a second side that faces the first wiring, and wherein the extension section is disposed on at least the first side of the connection region and is not disposed on the second side.

18. A semiconductor device having a wiring pattern formed by etching a conductive layer using a resist pattern as a mask, the semiconductor device comprising:

a contact section formed in an interlayer dielectric layer;

a first wiring formed over the interlayer dielectric layer and disposed with a predetermined inter-wiring separation with respect to the contact section; and a second wiring having a connection region to be connected to the contact section and having a section extending in parallel with the first wiring and a section extending in a direction perpendicular to the first wiring, wherein the connection region of the second wiring has a generally square plan configuration, the second wiring has an extension section extending in a non-wiring region in the connection region, and the extension section does not extend from a sides of the connection region facing the first wiring.

19. The semiconductor device according to claim 18, wherein the connection region has a first side and a second side that faces the first wiring, and wherein the extension section is disposed on at least the first side of the connection region and is not disposed on the second side.

20. A semiconductor device having a wiring pattern formed by etching a conductive layer using a resist pattern as a mask, the semiconductor device comprising:

a contact section formed in an interlayer dielectric layer;

a first wiring formed over the interlayer dielectric layer and disposed with a predetermined inter-wiring separation with respect to the contact section; and a second wiring having only a connection region to be connected to the contact section, wherein the connection region of the second wiring has a generally square plan configuration, the second wiring has an extension section extending in a non-wiring region in the connection region; and the extension section does not extend from a sides of the connection region facing the first wiring.

21. The semiconductor device according to claim 20, wherein the connection region has a first side and a second side that faces the first wiring, and wherein the extension section is disposed on at least the first side of the connection region and is not disposed on the second side.

22. A semiconductor device having a wiring pattern formed by etching a conductive layer using a resist pattern as a mask, the semiconductor device comprising:

a contact section formed in an interlayer dielectric layer;

a plurality of first wirings formed over the interlayer dielectric layer and disposed with a predetermined inter-wiring separation with respect to the contact section; and a second wiring having at least one connection region to be connected to the contact section, wherein the connection region of the second wiring has a generally square plan configuration, the second wiring has an extension section extending in a non-wiring region in the connection region, and the extension section does not extend from a sides of the connection region facing the plurality of first wirings.

23. The semiconductor device according to claim 22, wherein the connection region has a first side and a second side that faces the first wiring, and wherein the extension section is disposed on at least the first side of the connection region and is not disposed on the second side.

24. A semiconductor device having a wiring pattern formed by etching a conductive layer using a resist pattern as a mask, the semiconductor device comprising:

a contact section formed in an interlayer dielectric layer; and a wiring having a connection region to be connected to the contact section, wherein the connection region of the wiring has a generally square plan configuration, and the wiring has an extension section extending in a non-wiring region in the connection region, and the extension section does not extend from a side of the connection region facing the plurality of first wirings.

25. The semiconductor device according to claim 24, wherein the wiring is line-like in shape and has extension sections on three sides of the connection region.

26. The semiconductor device according to claim 24, wherein the wiring is formed from the connection region and has extension sections on four sides of the connection region.

27. The semiconductor device according to claim 24, wherein the connection region has a first side and a second side that faces the first wiring, and wherein the extension section is disposed on at least the first side of the connection region and is not disposed on the second side.

* * * * *